US008698359B2

(12) United States Patent
Ishishita et al.

(10) Patent No.: US 8,698,359 B2
(45) Date of Patent: Apr. 15, 2014

(54) ELECTRIC STORAGE SYSTEM

(75) Inventors: Teruo Ishishita, Miyoshi (JP); Keiji Kaita, Miyoshi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/513,071

(22) PCT Filed: Oct. 24, 2011

(86) PCT No.: PCT/JP2011/005935
§ 371 (c)(1),
(2), (4) Date: May 31, 2012

(87) PCT Pub. No.: WO2013/061358
PCT Pub. Date: May 2, 2013

(65) Prior Publication Data
US 2013/0320766 A1  Dec. 5, 2013

(51) Int. Cl.
*H02H 9/00* (2006.01)
*H03K 17/06* (2006.01)
(52) U.S. Cl.
CPC .............. *H02H 9/001* (2013.01); *H02H 9/002* (2013.01); *H03K 17/06* (2013.01)
USPC .............. 307/131; 307/9.1; 307/77; 307/112
(58) Field of Classification Search
CPC ........ H02H 9/001; H02H 9/002; H03K 17/06
USPC ..................... 307/9.1, 77, 112, 131
See application file for complete search history.

(56) References Cited

U.S. PATENT DOCUMENTS

| 6,281,662 | B1* | 8/2001 | Flohr ............................ 320/141 |
| 7,193,390 | B2* | 3/2007 | Nagai et al. .................. 320/116 |
| 7,898,103 | B2* | 3/2011 | Oyobe et al. .................. 307/9.1 |
| 8,513,953 | B2* | 8/2013 | Myoen et al. ................. 324/538 |
| 2010/0214055 | A1* | 8/2010 | Fuji et al. ..................... 340/3.1 |
| 2011/0115416 | A1* | 5/2011 | Oh et al. ....................... 318/139 |
| 2012/0068532 | A1* | 3/2012 | Tanabe et al. ................ 307/10.1 |

FOREIGN PATENT DOCUMENTS

| JP | A-11-346443 | 12/1999 |
| JP | A-2002-289263 | 10/2002 |
| JP | A-2008-182779 | 8/2008 |

OTHER PUBLICATIONS

International Search Report issued in International Application No. PCT/JP2011/005935 on Jan. 10, 2012 (with translation).

* cited by examiner

*Primary Examiner* — Adi Amrany
(74) *Attorney, Agent, or Firm* — Oliff PLC

(57) ABSTRACT

An electric storage system includes an electric storage apparatus, relays, a plurality of smoothing capacitors, and a current limiting resistance. The electric storage apparatus has a plurality of electric storage elements connected in series. Each of the electric storage elements includes a current breaker breaking an electric current path inside the electric storage element. The plurality of smoothing capacitors are connected in series between a positive electrode line and a negative electrode line which connect the electric storage apparatus to a load. Each of the relays is placed on the positive electrode line, the negative electrode line, and an intermediate line. The intermediate line connects a connecting point of two of the electric storage elements included in the electric storage apparatus and a connecting point of the plurality of smoothing capacitors. The current limiting resistance is also placed on the intermediate line.

20 Claims, 10 Drawing Sheets

ELECTRIC STORAGE SYSTEM

TECHNICAL FIELD

The present invention relates to an electric storage system having an electric storage apparatus including a plurality of electric storage elements connected in series, each of the electric storage elements incorporating a current breaker.

BACKGROUND ART

Patent Document 1 has described a cell which incorporates a current breaker. Overcharging or overdischarging of the cell may produce gas to increase the internal pressure of the cell. When the internal pressure of the cell is increased, the current breaker is deformed to break a current path within the cell.

PRIOR ART DOCUMENT

Patent Document

[Patent Document 1] Japanese Patent Laid-Open No. 2008-182779

SUMMARY OF THE INVENTION

Problems to be Solved by the Invention

In view of application to a storage battery for driving of a hybrid vehicle, an electric vehicle and the like, a plurality of cells each incorporating a current breaker may be connected in series to constitute an assembled battery. When a current breaker incorporated in any of the cells is activated in the assembled battery, a voltage of the assembled battery may be applied between terminals of the current breaker. To address this, the current breaker can be provided with a structure which withstands a high voltage. In this case, however, the current breaker is increased in size, or the cost of the current breaker is increased.

Means for Solving the Problems

An electric storage system according to the present invention includes an electric storage apparatus, relays, a plurality of smoothing capacitors, and a current limiting resistance. The electric storage apparatus has a plurality of electric storage elements connected in series. Each of the electric storage elements includes a current breaker breaking an electric current path inside the electric storage element. The plurality of smoothing capacitors are connected in series between a positive electrode line and a negative electrode line which connect the electric storage apparatus to a load. Each of the relays is placed on the positive electrode line, the negative electrode line, and an intermediate line. The intermediate line connects a connecting point of two of the electric storage elements included in the electric storage apparatus and a connecting point of the plurality of smoothing capacitors. The current limiting resistance is also placed on the intermediate line.

According to the present invention, it is possible to reduce a voltage applied to terminals of the current breaker included in the electric storage element when the current breaker is activated. Since the intermediate line is connected to the electric storage apparatus, the plurality of electric storage elements constituting the electric storage apparatus can be separated at the connecting point to the intermediate line as the boundary. If the intermediate line is omitted, a voltage of the electric storage apparatus may be applied between the terminals of the activated current breaker. In contrast, when the intermediate line is used to separate the plurality of electric storage elements constituting the electric storage apparatus, the voltage applied between the terminals of the current breaker can be lower than the voltage of the electric storage apparatus.

Since the voltage applied between the terminals of the current breaker is reduced, the structure of the current breaker can be simplified in terms of withstanding of a high voltage. This can suppress an increase in size of the current breaker or an increased cost. In addition, according to the present invention, the current limiting resistance is placed on the intermediate line, so that it is possible to prevent a flow of inrush current through the smoothing capacitor when the smoothing capacitor is precharged.

The electric storage apparatus can be divided into a first group and a second group which include substantially equal numbers of electric storage elements. The intermediate line can be connected to a connecting point of the first group and the second group. The smoothing capacitor can be connected in parallel with the first group through the positive electrode line and the intermediate line. The smoothing capacitor can be connected in parallel with the second group through the negative electrode line and the intermediate line.

A controller can control ON and OFF of each of the relays. For connecting the electric storage apparatus to the load, the controller first switches the relay placed on one of the positive electrode line and the negative electrode line and the relay placed on the intermediate line from OFF to ON. Next, the controller switches the relay placed on the other of the positive electrode line and the negative electrode line from OFF to ON. Through the control of each of the relays, a flow of inrush current through the smoothing capacitor can be prevented by passing an electric current through the current limiting resistance placed on the intermediate line.

A first current sensor can be used to detect the value of an electric current passing through the positive electrode line, and a second current sensor can be used to detect the value of an electric current passing through the negative electrode line. The controller can use the detection results of the first current sensor and the second current sensor to obtain the value of an electric current passing through the intermediate line. Since the current limiting resistance is placed on the intermediate line, the heat generation state of the current limiting resistance can be monitored by obtaining the value of the electric current passing through the intermediate line. The controller can limit charge and discharge of the electric storage apparatus in response to an increase in the electric current value of the intermediate line. The limitation of the charge and discharge of the electric storage apparatus can reduce the value of the electric current passing through the intermediate line (current limiting resistance) to suppress the heat generation of the current limiting resistance.

When charge and discharge of the electric storage apparatus are limited and the electric current value of the intermediate line is higher than a first threshold value, an upper limit to power with which the charge or discharge of the electric storage apparatus is allowed can be reduced. It is possible to turn off the relays placed on the positive electrode line, the negative electrode line, and the intermediate line when the electric current value of the intermediate line is higher than a second threshold value. The turn-off of the relays can prevent charge and discharge of the electric storage apparatus to preclude an electric current from passing through the intermediate line (current limiting resistance).

A temperature sensor can be used to detect the temperature of the current limiting resistance. The controller can limit charge and discharge of the electric storage apparatus in response to an increase in the temperature detected by the temperature sensor. The limitation of the charge and discharge of the electric storage apparatus when the temperature of the current limiting resistance is increased can reduce the value of the electric current passing through the current limiting resistance to suppress the heat generation of the current limiting resistance.

When charge and discharge of the electric storage apparatus are limited and the temperature of the current limiting resistance is higher than a first threshold value, an upper limit to power with which charge or discharge of the electric storage apparatus is allowed can be reduced. It is possible to turn off the relays placed on the positive electrode line, the negative electrode line, and the intermediate line when the temperature of the current limiting resistance is higher than a second threshold value. The turn-off of the relays can prevent charge and discharge of the electric storage apparatus to preclude an electric current from passing through the intermediate line (current limiting resistance).

MODE FOR CARRYING OUT THE INVENTION

Embodiments of the present invention will hereinafter be described.

Embodiment 1

Figure 1:
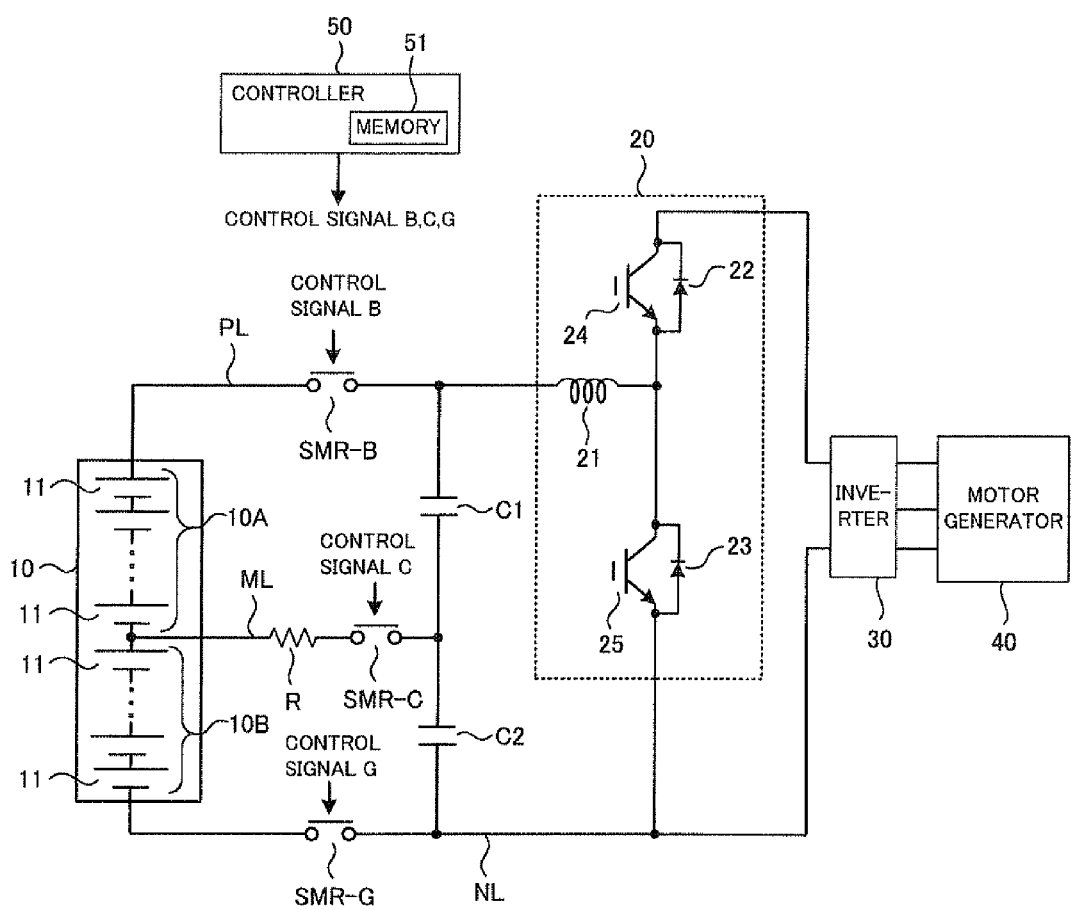
FIG. 1 is a diagram showing the configuration of a battery system which is Embodiment 1.

A battery system (electric storage system) which is Embodiment 1 of the present invention is described. FIG. 1 is a schematic diagram showing the configuration of a battery system.

The battery system according to the present embodiment is mounted on a vehicle. Examples of the vehicle include a hybrid vehicle and an electric vehicle. The hybrid vehicle includes an engine or a fuel cell in addition to an assembled battery as the power source for running of the vehicle. The electric vehicle includes only an assembled battery as the power source for running of the vehicle.

An assembled battery (electric storage apparatus) 10 has a plurality of cells (electric storage elements) 11 connected in series. A secondary battery such as a nickel metal hydride battery and a lithium-ion battery can be used as each of the cells 11. Instead of the secondary battery, an electric double layer capacitor (capacitor) can be used. The number of the cells 11 can be set as appropriate by considering the required output of the assembled battery 10. While the plurality of cells 11 are connected in series in the present embodiment, the plurality of cells 11 may be connected in parallel and included in the assembled battery 10.

A system main relay SMR-B is placed on a positive electrode line PL of the assembled battery 10. The system main relay SNR-B is switched between ON and OFF in response to a control signal B from a controller 50. A system main relay SMR-G is placed on a negative electrode line NL of the assembled battery 10. The system main relay SMR-G is switched between ON and OFF in response to a control signal G from the controller 50.

The controller 50 incorporates a memory 51. The memory 51 has a program for operating the controller 50 and various types of information stored therein. The memory 51 may be placed outside the controller 50.

Capacitors C1 and C2 are connected in series between the positive electrode line PL and the negative electrode line NL. One end of the capacitor C1 is connected to the positive electrode line PL, and one end of the capacitor C2 is connected to the negative electrode line NL. The capacitors C1 and C2 are used to smooth an electric current between the positive electrode line PL and the negative electrode line NL.

A system main relay SMR-C and a current limiting resistance R are placed on an intermediate line ML. The current limiting resistance R is used to suppress a flow of inrush current through a load when the assembled battery 10 is connected to the load. The system main relay SMR-C is switched between ON and OFF in response to a control signal C from the controller 50.

One end of the intermediate line ML is connected to a connecting point of a first battery group 10A and a second battery group 10B included in the assembled battery 10. The other end of the intermediate line ML is connected to a connecting point of the capacitors C1 and C2. The capacitor C1 is connected in parallel with the first battery group 10A through the positive electrode line PL1 and the intermediate line ML. The capacitor C2 is connected in parallel with the second battery group 10B through the negative electrode line NL and the intermediate line ML.

Preferably, the number of the cells 11 included in the first battery group 10A is substantially equal to the number of the cells 11 included in the second battery group 10B. The cases in which the numbers of the cells 11 are substantially equal to each other include the case in which the numbers of the cells 11 are identical to each other and the case in which the numbers of the cell 11 are slightly different from each other.

A step-up circuit 20 increases an output voltage of the assembled battery 10 and outputs the increased power to an inverter 30. The step-up circuit 20 can reduce an output voltage of the inverter 30 and output the reduced power to the assembled battery 10. The step-up circuit 20 has a reactor 21, diodes 22 and 23, and transistors (npn-type transistors) 24 and 25 serving as switching elements. The reactor 21 has one end connected to the system main relay SMR-B and the other end connected to a connecting point of the transistors 24 and 25.

The transistors 24 and 25 are connected in series with each other, and a control signal from the controller 50 is input to bases of the transistors 24 and 25. The transistors 24 and 25 are switched between ON and OFF in response to the control signal from the controller 50. The diodes 22 and 23 are connected between collectors and emitters of the transistors 24 and 25, respectively, to pass an electric current from the emitter side to the collector side. Specifically, anodes of the diodes 22 and 23 are connected to the emitters of the transistors 24 and 25, respectively, and cathodes of the diodes 22 and 23 are connected to the collectors of the transistors 24 and 25, respectively.

For example, an IGBT (Insulated Gate Bipolar Transistor) can also be used as each of the transistors 24 and 25. A power switching element can also be used such as a power MOSFET (Metal Oxide Semiconductor Field-Effect Transistor), instead of the npn-type transistor.

In performing the step-up operation by the step-up circuit 20, the controller 50 turns on the transistor 25 and turns off the transistor 24. This causes an electric current to pass from the assembled battery 10 to the reactor 21, and a magnetic field energy is accumulated on the reactor 21 in accordance with the amount of the electric current. Next, the controller 50 switches the transistor 25 from ON to OFF to cause the electric current to pass from the reactor 21 to the inverter 30 through the diode 22. This allows the energy accumulated on the reactor 21 to be released to achieve the step-up operation.

In performing the step-down operation, the controller 50 turns on the transistor 24 and turns off the transistor 25. This causes power from the inverter 30 to be supplied to the assembled battery 10 to charge the assembled battery 10. While the step-up circuit 20 is provided in the present embodiment, the step-up circuit 20 may be omitted.

The inverter 30 converts a DC power from the assembled battery 10 into an AC power and outputs the AC power to a motor generator 40. A three-phase AC motor can be used as the motor generator 40. The motor generator 40 receives the AC power from the inverter 30 to generate a kinetic energy for running of the vehicle. The kinetic energy generated by the motor generator 40 is transferred to wheels.

For decelerating or stopping the vehicle, the motor generator 40 converts a kinetic energy produced in braking of the vehicle into an electric energy. The AC power generated by the motor generator 40 is converted into a DC power by the inverter 30 and then output to the assembled battery 10. The assembled battery 10 can store the regenerative power.

The assembled battery 10 can be charged with power of an external power source. The external power source is a power source placed outside the vehicle, and for example, a commercial power source can be used as the external power source. For supplying the power of the external power source to the assembled battery 10, a charger can be added to the battery system shown in FIG. 1. When the external power source supplies an AC power, the charger can convert the AC power into a DC power and supply the DC power to the assembled battery 10. When the external power source supplies a DC power, the DC power can be supplied to the assembled battery 10.

Figure 2:
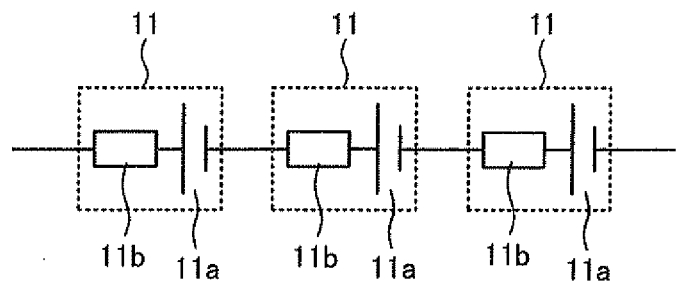
FIG. 2 is a diagram showing the configuration of a cell.

FIG. 2 shows the configuration of the cell 11. The cell 11 has a power-generating element 11a which achieves charge and discharge and a current breaker 11b which breaks an electric current passing through the cell 11. The power-generating element 11a can be formed of a positive electrode element, a negative electrode element, and a separator placed between the positive electrode element and the negative electrode element, for example. The positive electrode element has a collector plate and a positive electrode active material layer. The negative electrode element has a collector plate and a negative electrode active material layer. The separator, the positive electrode active material layer, and the negative electrode active material layer are impregnated with an electrolytic solution. A solid electrolyte may be used instead of the electrolytic solution.

The current breaker 11b is incorporated in the cell 11, and breaks an electric current passing through the cell 11 when the cell 11 is in an overcharged state or the like. The current breaker 11b can be provided by using, for example a valve which is deformed in accordance with the internal pressure of the cell 11. The overcharging of the cell 11 or the like may produce gas within the cell 11. The produced gas increases the internal pressure of the cell 11, and the valve can be deformed in response to the increased internal pressure. The deformation of the valve mechanically breaks the connection to the power-generating element 11a, so that the electric current path through the cell 11 can be broken.

The current breaker 11b is not limited to the above-mentioned configuration including the valve. Specifically, it is only required that the current breaker 11b should break the electric current path within the cell 11 in order to avoid an abnormal state of the cell 11. For example, a fuse can be used as the current breaker 11b. With the use of the fuse, the fuse can be blown when an electric current equal to or higher than a predetermined value passes through the cell 11 (fuse).

Figure 3:
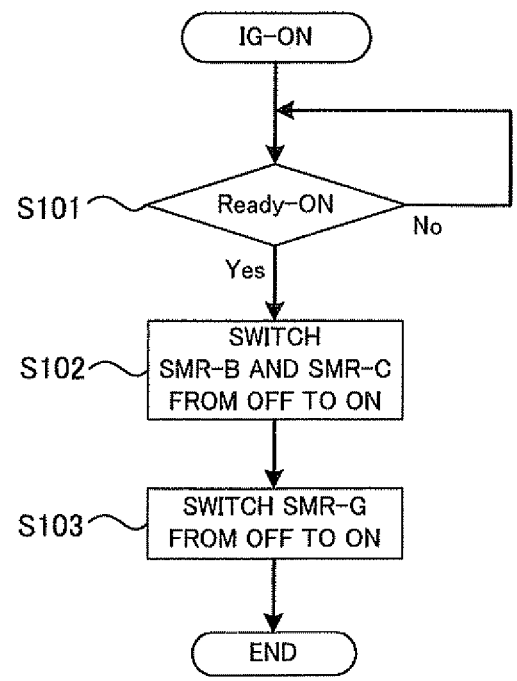
FIG. 3 is a flow chart for describing processing in response to turn-on of an ignition switch.

The operation of the battery system according to the present embodiment is described with reference to a flow chart shown in FIG. 3. The processing shown in FIG. 3 is performed by the controller 50. The processing shown in FIG. 3 is performed when an ignition switch of the vehicle is turned from OFF to ON. At the start of the processing shown, in FIG. 3, the system main relays SMR-B, SYR-C, and SMR-G are OFF.

At step S101, the controller 50 determines whether or not a request for start-up of the battery system (Ready-ON) is present. When the request for start-up of the battery system is present, the procedure proceeds to processing at step S102.

At step S102, the controller 50 switches the system main relays SMR-B and SMR-C from OFF to ON. The capacitor C1 is precharged with an electric current from the assembled battery 10 (first battery group 10A). Since the electric current passes through the current limiting resistance R in the precharging of the capacitor C1, a flow of inrush current through the capacitor C1 can be prevented.

At step S103, the controller 50 switches the system main relay SMR-G from OFF to ON. The capacitor C2 is precharged with an electric current from the assembled battery 10. Since the electric current from the second battery group 10B passes through the current limiting resistance R in the precharging of the capacitor C2, a flow of inrush current through the capacitor C2 can be prevented. The connection between the assembled battery 10 and the step-up circuit 20 is completed by turning on the system main relays SMR-B, SMR-C, and SMR-G.

While the system main relay SMR-G is switched from OFF to ON after the switching of the system main relays SMR-B and SMR-C from OFF to ON in the present embodiment, the present invention is not limited thereto. For example, the system main relay SMR-B can be switched from OFF to ON after the system main relays SMR-C and SMR-G are switched from OFF to ON. In switching the system main relays SMR-B, SMR-C, and SMR-G from OFF to ON, it is only required that the system main relay SMR-C connected in series with the current limiting resistance R should be switched from OFF to ON first.

If the current breaker 11b is activated in any of the cells 11 during charge or discharge of the assembled battery 10, a voltage is applied between the terminals of the activated current breaker 11b. According to the present embodiment, the intermediate line ML provided for the system can reduce the voltage applied between the terminals of the current breaker 11b as compared with the configuration in which the intermediate line ML is omitted.

For example, when the current breaker 11b of the cell 11 included in the first battery group 10A is activated during discharge of the assembled battery 10, a voltage associated with the first battery group 10A is applied between the terminals of the current breaker 11b. Since an electric current from the second battery group 10B can be passed to the capacitors C1 and C2 through the intermediate line ML, it is possible to prevent a voltage of the second battery group 10B from being applied between the terminals of the activated current breaker 11b.

By way of example, when the current breaker 11b of the cell 11 connected to the positive electrode line PL is activated in the first battery group 10A, a reverse voltage corresponding to the voltage of the first battery group 10A is generally applied between the terminals of that current breaker 11b. If the intermediate line ML is omitted, a reverse voltage corresponding to the voltage of the assembled battery 10 is applied between the terminals of the current breaker 11b. Since the voltage of the first battery group 10A is lower than the voltage of the assembled battery 10, the voltage applied between the terminals of the current breaker 11b can be reduced according to the present embodiment.

For example, when the current breaker 11b of the cell 11 included in the first battery group 10A is activated during charge of the assembled battery 10, a voltage associated with the voltages of the first battery group 10A and the capacitor C1 is applied between the terminals of the activated current breaker 11b. Since the intermediate line ML is used, the charging current can be passed through the second battery group 10B.

By way of example, when the current breaker 11b of the cell 11 connected to the positive electrode line PL is activated in the first battery group 10A, electrical charge is accumulated on the capacitor C1 to increase the voltage of the capacitor C1. A voltage corresponding to a difference between the voltage of the first battery group 10A and the voltage of the capacitor C1 is applied between the terminals of the activated current breaker 11b. If the intermediate line ML is omitted, a voltage corresponding to a difference between the voltage of the assembled battery 10 and the voltages of the capacitor C1 and C2 is applied between the terminals of the activated current breaker 11b. Since the voltage of the first battery group 10A is lower than the voltage of the assembled battery 10, the voltage applied between the terminals of the current breaker 11b can be reduced according to the present embodiment.

According to the present embodiment, when one of the battery groups 10A and 10B fails, the output of the other battery group which does not fail can be used to run the vehicle. For example, when the current breaker 11b of the cell 11 included in the first battery group 10A is activated, the output of the second battery group 10B can be used to run the vehicle.

While the current limiting resistance R is placed on the intermediate line ML in the battery system of the present embodiment, the current limiting resistance R may be placed on the positive electrode line PL or the negative electrode line NL. The times to switch the system main relays SMR-B, SMR-C, and SMR-G from OFF to ON may be changed depending on the position of the current limiting resistance R. The system main relay SMR-C connected in series with the current limiting resistance R may be first switched from OFF to ON. This can pass an electric current through the current limiting resistance R to suppress an inrush current.

While the current limiting resistance R and the system main relay SMR-C are placed on the intermediate line ML in the battery system of the present embodiment, the current limiting resistance R and the system main relay SMR-C may be omitted. Alternatively, the system main relay SMR-C may be omitted and only the current limiting resistance R may be provided on the intermediate line ML.

Embodiment 2

Figure 4:
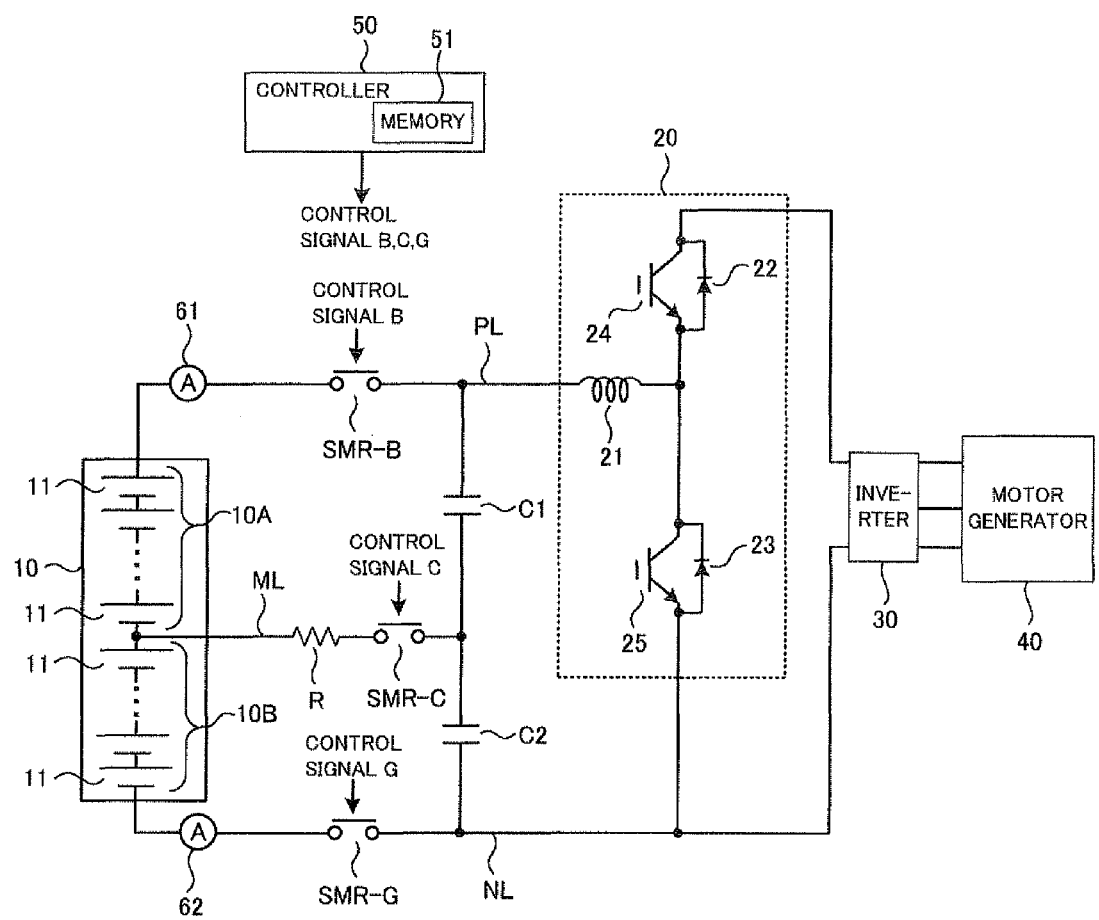
FIG. 4 is a diagram showing the configuration of a battery system which is Embodiment 2.

A battery system which is Embodiment 2 of the present invention is described. FIG. 4 shows the configuration of the battery system according to the present embodiment. Members identical to those described in Embodiment 1 are designated with the same reference numerals, and detailed description thereof is omitted. The following description focuses on differences from Embodiment 1.

In the present embodiment, a current sensor 61 is placed on a positive electrode line PL, and a current sensor 62 is placed on a negative electrode line NL. A controller 50 receives outputs of the current sensors 61 and 62 to obtain the values of electric currents passing through the positive electrode line PL and the negative electrode line NL, respectively. The current value when an assembled battery 10 is discharged can be set to a negative value, whereas the current value when the assembled battery 10 is charged can be set to a positive value.

The use of the current sensors 61 and 62 allows the detection of the current values when the assembled battery 10 is charged and discharged. In addition, the current values detected by the current sensors 61 and 62 can be compared to determine any abnormality of the current sensors 61 and 62.

When the assembled battery 10 is charged or discharged, the values of electric currents passing through the positive electrode line PL and the negative electrode line NL are equal to each other. If the current sensors 61 and 62 are in a normal state, the current value detected by the current sensor 61 is equal to the current value detected by the current sensor 62. If one of the current sensors 61 and 62 is in an abnormal state, the current value detected by the current sensor 61 is different from the current value detected by the current sensor 62. Thus, the comparison between the current values detected by the current sensors 61 and 62 allows the determination of whether or not any of the current sensors 61 and 62 is in an abnormal state.

In addition, the use of the current sensors 61 and 62 enables monitoring of an electric current passing through an intermediate line ML, that is, an electric current passing through a current limiting resistance R. Since the current limiting resistance R generates heat when an electric current passes through the current limiting resistance R, the electric current passing through the current limiting resistance R can be monitored to determine whether or not the current limiting resistance R generates excessive heat. If the current limiting resistance R generates excessive heat, the electric current passing through the current limiting resistance R is limited and thus the heat generation of the current limiting resistance R can be suppressed.

Since the intermediate line ML is provided in the present embodiment similarly to Embodiment 1, it is possible to reduce a voltage applied between terminals of a current breaker 11b of a cell 11 when the current breaker 11b is activated. In addition, the current limiting resistance R is provided on the intermediate line ML, so that a flow of inrush current can be prevented.

Figure 5:
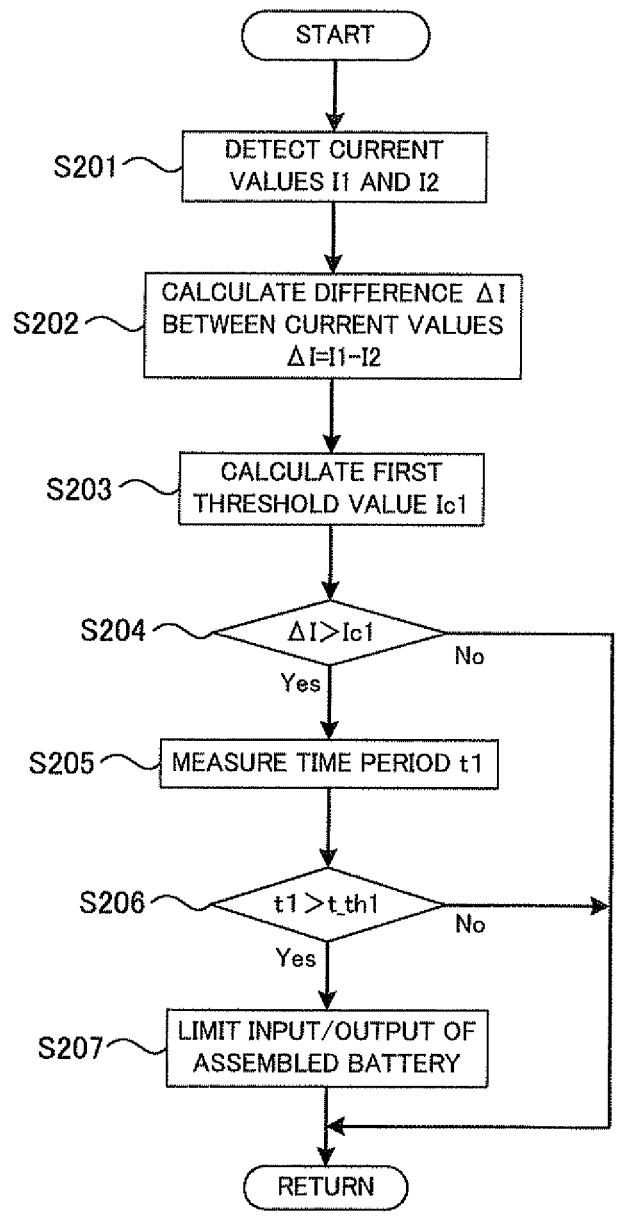
FIG. 5 is a flow chart showing part of processing in the battery system which is Embodiment 2.

FIG. 5 is a flow chart for describing part of processing in the battery system according to the present embodiment. The processing shown in FIG. 5 is performed by the controller 50.

At step S201, the controller 50 obtains a current value I1 of an electric current passing through the positive electrode line PL and a current value I2 of an electric current passing through the negative electrode line NL based on the outputs of the current sensors 61 and 62. At step S202, the controller 50 calculates a difference ΔI between the current values I1 and I2 obtained at step S201. Specifically, the controller 50 subtracts the current value I2 from the current value I1 to calculate the difference ΔI. The difference ΔI is equal to the value of an electric current passing through the current limiting resistance R. The difference ΔI is a positive or negative value depending on charge or discharge of the assembled battery 10.

At step S203, the controller 50 calculates a first threshold value Ic1. The first threshold value Ic1 is a value relating to the current value and is used to determine whether or not the current limiting resistance R is in an abnormal state. The abnormal state refers to an abnormality associated with heat generation of the current limiting resistance R. The first threshold value Ic1 may be a fixed value or may be changed in accordance with the use environments of the assembled battery 10. For changing the first threshold value Ic1, a map representing the correspondence between the use environments of the assembled battery 10 and the first threshold value Ic1 is previously prepared and the map can be used to determine the first threshold value Ic1 associated with the use environments of the assembled battery 10. Information about the map can be stored in a memory 51.

It is possible to consider, as the use environments of the assembled battery 10, the temperature of the assembled battery 10, the temperature outside the assembled battery 10, and the temperature of a heat exchange medium used for adjusting the temperature of the assembled battery 10, for example. At least one of those temperatures can be considered to create the abovementioned map. The current limiting resistance R can be placed at a position adjacent to the assembled battery 10 together with system main relays SMR-B, SNR-C, and SMR-G. In this case, the first threshold value Ic1 can be determined by considering the abovementioned temperatures.

When a temperature sensor is placed on a surface or the like of the assembled battery 10, the temperature of the assembled battery 10 can be obtained from an output of the temperature sensor. When a temperature sensor is placed outside the assembled battery 10, the temperature outside the assembled battery 10 can be obtained from an output of the temperature sensor. When a temperature sensor is placed on a path for supplying the heat exchange medium to the assembled battery 10, the temperature of the heat exchange medium can be obtained from an output of the temperature sensor. When the assembled battery 10 generates heat, a heat exchange medium for cooling the assembled battery 10 is used. When the assembled battery 10 is cold, a heat exchange medium for heating the assembled battery 10 is used. Gas or liquid can be used as the heat exchange medium.

At step S204, the controller 50 determines whether or not the difference ΔI calculated at step S202 is larger than the first threshold value Ic1 calculated at step S203. Since the difference ΔI has a positive or negative value depending on the charge or discharge of the assembled battery 10, the absolute value of the difference ΔI can be compared with the first threshold value Ic1 in the comparison between the difference ΔI and the first threshold value Ic1. When the difference ΔI is larger than the first threshold value Ic1, the procedure proceeds to processing at step S205, and when not, the procedure is ended.

At step S205, the controller 50 measures a time period t1 with a timer. The time period t1 is a time period (duration) for which the difference ΔI is larger than the first threshold value Ic1. At step S206, the controller 50 determines whether or not the time period t1 measured at step S205 is longer than a predetermined time period t_th1. The predetermined time period t_th1 can be set as appropriate, and information about the predetermined time period t_th1 can be stored in the memory 51.

As described later, the input/output of the assembled battery 10 may be limited depending on the relationship between the measured time period t1 and the predetermined time period t_th1. As the predetermined time period t_th1 is set to be shorter, the input/output of the assembled battery 10 is limited more easily. As the predetermined time period t_th1 is set to be longer, the input/output of the assembled battery 10 is limited less easily. The predetermined time period t_th1 can be set as appropriate by taking account of that fact and the heat generation state of the current limiting resistance R.

When the measured time period t1 is longer than the predetermined time period t_th1, the procedure proceeds to processing at step S207, or when not, the procedure is ended. When the procedure proceeds to the processing at step S207, it is determined that the current limiting resistance R generates excessive heat and it is necessary to limit the value of the electric current passing through the current limiting resistance R.

At step S207, the controller 50 limits the input/output (charge/discharge) of the assembled battery 10. Control of the input/output of the assembled battery 10 is performed such that the input power or the output power of the assembled battery 10 does not exceed a preset allowable power. The allowable power refers to a maximum value (upper limit power) for allowing the input/output of the assembled battery 10 and is set for each of the input power and the output power.

For limiting the input/output of the assembled battery 10, the allowable power can be changed, for example. The input/output of the assembled battery 10 is limited by reducing the allowable power. The allowable power can be reduced in stages. For example, a plurality of threshold values different from each other can be provided, and each time the difference ΔI is larger than each of the threshold values, the allowable power can be reduced. In addition, a plurality of predetermined time periods different from each other can be provided, and each time the measured time period t1 is longer than each of the predetermined time periods, the allowable power can be reduced. Alternatively, the allowable power can be set to zero so as not to perform the input/output of the assembled battery 10.

In the processing shown in FIG. 5, when the value of the electric current (difference ΔI) passing through the current limiting resistance R is larger than the first threshold value Ic1 over the predetermined time period t_th1, the input/output of the assembled battery 10 can be limited to reduce the value of the electric current passing through the current limiting resistance R. This can suppress the heat generation of the current limiting resistance R.

While it is determined whether or not the value of the electric current (difference ΔI) passing through the current limiting resistance R is larger than the first threshold value Ic1 over the predetermined time period t_th1 in the processing shown in FIG. 5, the present invention is not limited thereto. Specifically, the input/output of the assembled battery 10 may be limited at the time when the difference ΔI becomes larger than the first threshold value Ic1. In other words, the processing at step S205 and S206 may be omitted in FIG. 5.

Figure 6:
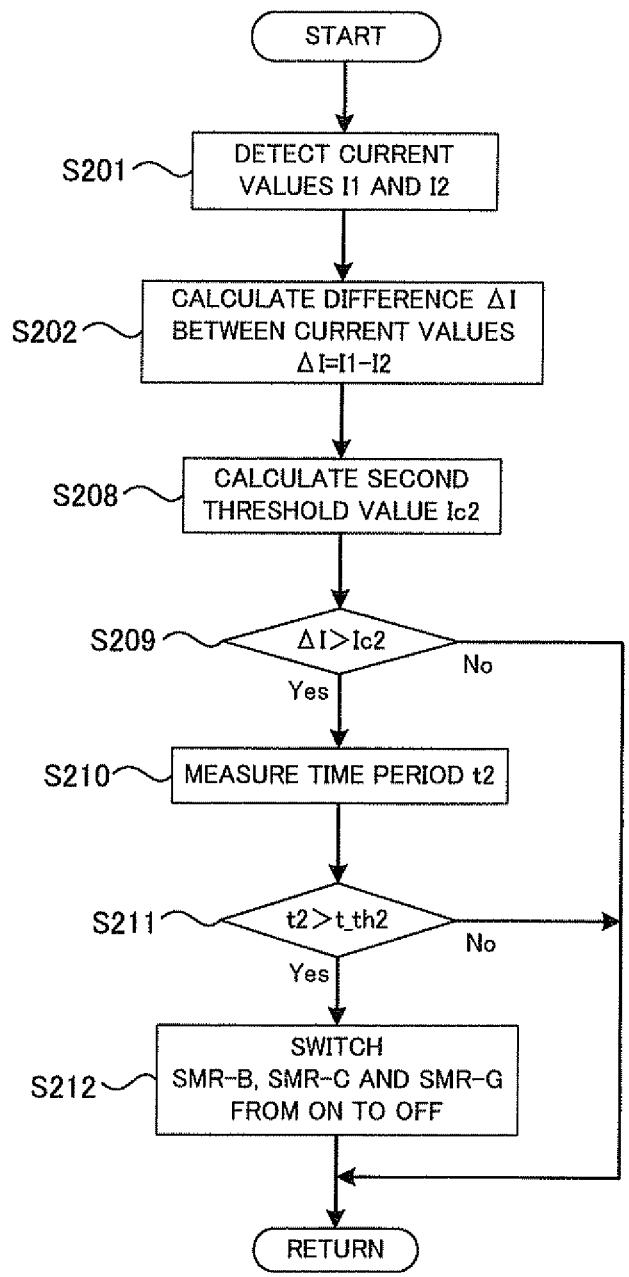
FIG. 6 is a flow chart showing part of the processing in the battery system which is Embodiment 2.

FIG. 6 is a flow chart for describing part of the processing in the battery system according to the present embodiment. The processing shown in FIG. 6 is performed by the controller 50. In the processing shown in FIG. 6, processing steps identical to those described in FIG. 5 are designated with the same reference numerals, and detailed description thereof is omitted.

At step S208, the controller 50 calculates a second threshold value Ic2. The second threshold value Ic2 is used to determined whether or not the current limiting resistance R is in an abnormal state (heat generation abnormality). The second threshold value Ic2 can be a value larger than the first threshold value Ic1.

The second threshold value Ic2 may be a fixed value or may be changed in accordance with the use environments of the assembled battery 10. For changing the second threshold value Ic2, a map representing the correspondence between the use environments of the assembled battery 10 and the second threshold value Ic2 is previously prepared and the map can be used to determine the second threshold value Ic2 associated with the use environments of the assembled battery 10, similarly to the change of the first threshold value Ic1.

At step S209, the controller 50 determines whether or not a difference ΔI calculated at step S202 is larger than the second threshold value Ic2 calculated at step S208. Since the difference ΔI has a negative or positive value depending on the charge or discharge of the assembled battery 10, the absolute value of the difference ΔI can be compared with the second threshold value Ic2 in the comparison between the difference ΔI and the second threshold value Ic2. When the difference ΔI is larger than the second threshold value Ic2, the procedure proceeds to processing at step S210, and when not, the procedure is ended.

At step S210, the controller 50 measures a time period t2 with a timer. The time period t2 is a time period (duration) for which the difference ΔI is larger than the second threshold value Ic2. At step S211, the controller 50 determines whether or not the time period t2 measured at step S210 is longer than a predetermined time period t_th2. The predetermined time period t_th2 can be set as appropriate, and information about the predetermined time period t_th2 can be stored in the memory 51. The predetermined time period t_th2 may be identical to or different from the predetermined time period t_th1 used at step S206 in FIG. 5.

As described later, the system main relays SMR-B, SMR-C, and SMR-G may be switched from ON to OFF to prevent the input/output of the assembled battery 10 depending on the relationship between the measured time period t2 and the predetermined time period t_th2. As the predetermined time period t_th2 is set to be shorter, the system main relays SMR-B, SMR-C, and SMR-G are switched from ON to OFF more easily. As the predetermined time period t_th2 is set to be longer, the system main relays SMR-B, SMR-C, and SMR-G are switched from ON to OFF less easily. The predetermined time period t_th2 can be set as appropriate by taking account of that fact and the heat generation state of the current limiting resistance R.

When the measured time period t2 is longer than the predetermined time period t_th2, the procedure proceeds to processing at step S212, or when not, the procedure is ended. At step S212, the controller 50 switches the system main relays SMR-B, SMR-C, and SMR-G from ON to OFF. This prevents the input/output of the assembled battery 10. When the vehicle in the present embodiment is a hybrid vehicle, the vehicle can be run by using the output of an engine or a fuel cell.

While the second threshold value Ic2 is set to be larger than the first threshold value Ic1 in the processing shown in FIG. 6, the second threshold value Ic2 can be set to the same value as the first threshold value Ic1. When the first threshold value Ic1 is the same value as the second threshold value Ic2, the processing shown in FIG. 6 can be given a higher priority than the processing shown in FIG. 5.

According to the processing shown in FIG. 6, the system main relays SMR-B, SMR-C, and SMR-G can be turned off to prevent an electric current from passing through the current limiting resistance R to suppress the heat generation of the current limiting resistance R. While the system main relays SMR-B, SMR-C, and SMR-G are switched from ON to OFF in the processing at step S212, only the system main relay SMR-C may be switched from ON to OFF instead. In this case, the heat generation of the current limiting resistance R can also be suppressed.

While it is determined whether or not the value of the electric current (difference ΔI) passing through the current limiting resistance R is larger than the second threshold value Ic2 over the predetermined time period t_th2 in the processing shown in FIG. 6, the present invention is not limited thereto. Specifically, the system main relays SMR-B, SMR-C, and SMR-G can be turned off to prevent the input/output of the assembled battery 10 at the time when the difference ΔI becomes larger than the second threshold value Ic2. In other words, the processing at step S210 and S211 may be omitted in FIG. 6.

Figure 7:
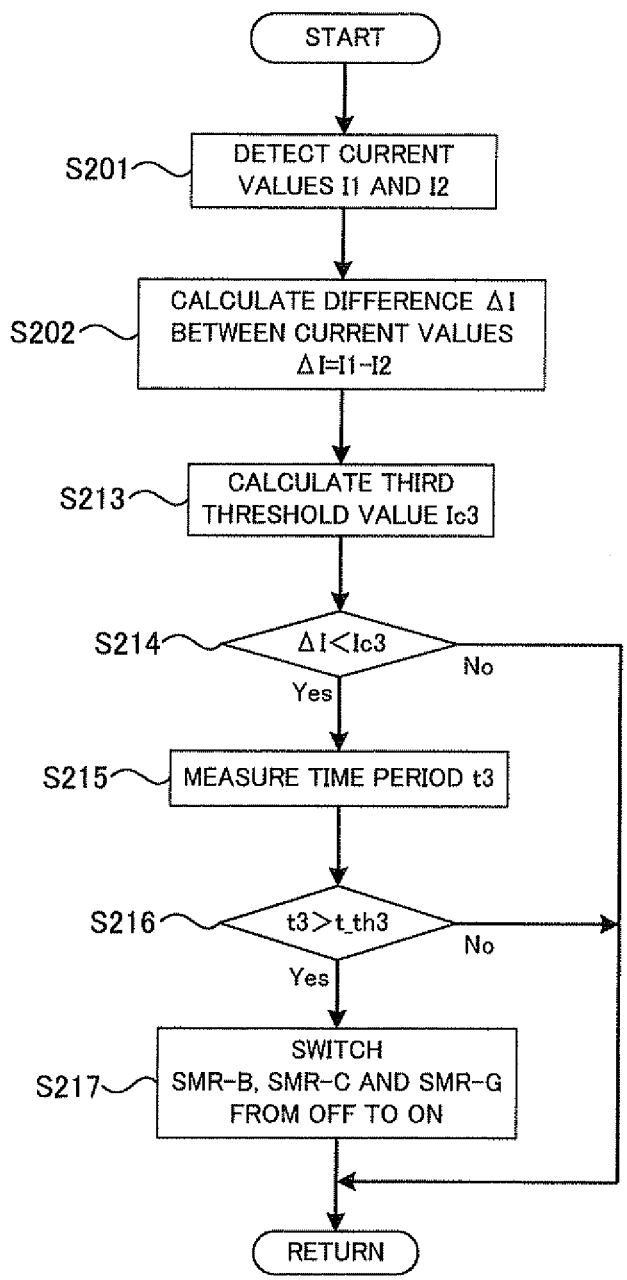
FIG. 7 is a flow chart showing part of the processing in the battery system which is Embodiment 2.

FIG. 7 is a flow chart for describing part of the processing in the battery system according to the present embodiment. The processing shown in FIG. 7 is performed by the controller 50. In the processing shown in FIG. 7, processing steps identical to those described in FIG. 5 are designated with the same reference numerals, and detailed description thereof is omitted. The processing shown in FIG. 7 can principally be performed after the system main relays SMR-B, SMR-C, and SMR-G are turned off through the processing at step S212 shown in FIG. 6.

At step S213, the controller 50 calculates a third threshold value Ic3. The third threshold value Ic3 is used to determine whether or not the current limiting resistance R is in a normal state. The normal state refers to a state in which the current limiting resistance R does not generate excessive heat. The third threshold value Ic3 can be a value smaller than the first threshold value Ic1 and the second threshold value Ic2.

The third threshold value Ic3 may be a fixed value or may be changed in accordance with the use environments of the assembled battery 10. For changing the third threshold value Ic3, a map representing the correspondence between the use environments of the assembled battery 10 and the third threshold value Ic3 is previously prepared and the map can be used to determine the third threshold value Ic3 associated with the use environments of the assembled battery 10, similarly to the change of the first threshold value Ic1 and the second threshold value Ic2.

At step S214, the controller 50 determines whether or not a difference ΔI calculated at step S202 is smaller than the third threshold value Ic3 calculated at step S213. Since the difference ΔI has a negative or positive value depending on the charge or discharge of the assembled battery 10, the absolute value of the difference ΔI can be compared with the third threshold value Ic3 in the comparison between the difference ΔI and the third threshold value Ic3. When the difference ΔI is smaller than the third threshold value Ic3, the procedure proceeds to processing at step S215, and when not, the procedure is ended.

At step S215, the controller 50 measures a time period t3 with a timer. The time period t3 is a time period (duration) for which the difference ΔI is smaller than the third threshold value Ic3. At step S216, the controller 50 determines whether or not the time period t3 measured at step S215 is longer than a predetermined time period t_th3. The predetermined time period t_th3 can be set as appropriate, and information about the predetermined time period t_th3 can be stored in the memory 51. The predetermined time period t_th3 may be identical to or different from the predetermined time period t_th1 used at step S206 in FIG. 5 or the predetermined time period t_th2 used at step S211 in FIG. 6.

As described later, the system main relays SMR-B, SMR-C, and SMR-G may be switched from OFF to ON to start the input/output of the assembled battery 10 depending on the relationship between the measured time period t3 and the predetermined time period t_th3. As the predetermined time period t_th3 is set to be shorter, the input/output of the assembled battery 10 is started more easily. As the predetermined time period t_th3 is set to be longer, the input/output of the assembled battery 10 is started less easily. The predetermined time period t_th3 can be set as appropriate by taking account of that fact and the heat generation state of the current limiting resistance R.

When the measured time period t3 is longer than the predetermined time period t_th3, the procedure proceeds to processing at step S217, or when not, the procedure is ended. At step S217, the controller 50 switches the system main relays SMR-B, SMR-C, and SMR-G from OFF to ON. The switching of the system main relays SMR-B, SMR-C, and SMR-G from OFF to ON is performed in the same manner as that of the processing shown in FIG. 3.

According to the processing shown in FIG. 7, the charge and discharge of the assembled battery 10 can be resumed with the heat generation of the current limiting resistance R suppressed.

In turning on the system main relays SMR-B, SMR-C, and SMR-G, the input/output of the assembled battery 10 may or may not be limited. When the input/output of the assembled battery 10 is limited, the limitation of the input/output can be canceled depending on the relationship between the difference ΔI and the first threshold value Ic1. Specifically, when the difference ΔI is smaller than the first threshold value Ic1, the limitation of the input/output of the assembled battery 10 can be canceled. On the other hand, when the difference ΔI is larger than the first threshold value Ic1, the limitation of the input/output of the assembled battery 10 can be continued.

While it is determined whether or not the value of the electric current (difference ΔI) passing through the current limiting resistance R is smaller than the third threshold value Ic3 over the predetermined time period t_th3 in the processing shown in FIG. 7, the present invention is not limited thereto. Specifically, the system main relays SMR-B, SMR-C, and SMR-G can be turned on to start the input/output of the assembled battery 10 at the time when the difference ΔI becomes smaller than the third threshold value Ic3. In other words, the processing at step S215 and S216 may be omitted in FIG. 7.

Embodiment 3

Figure 8:
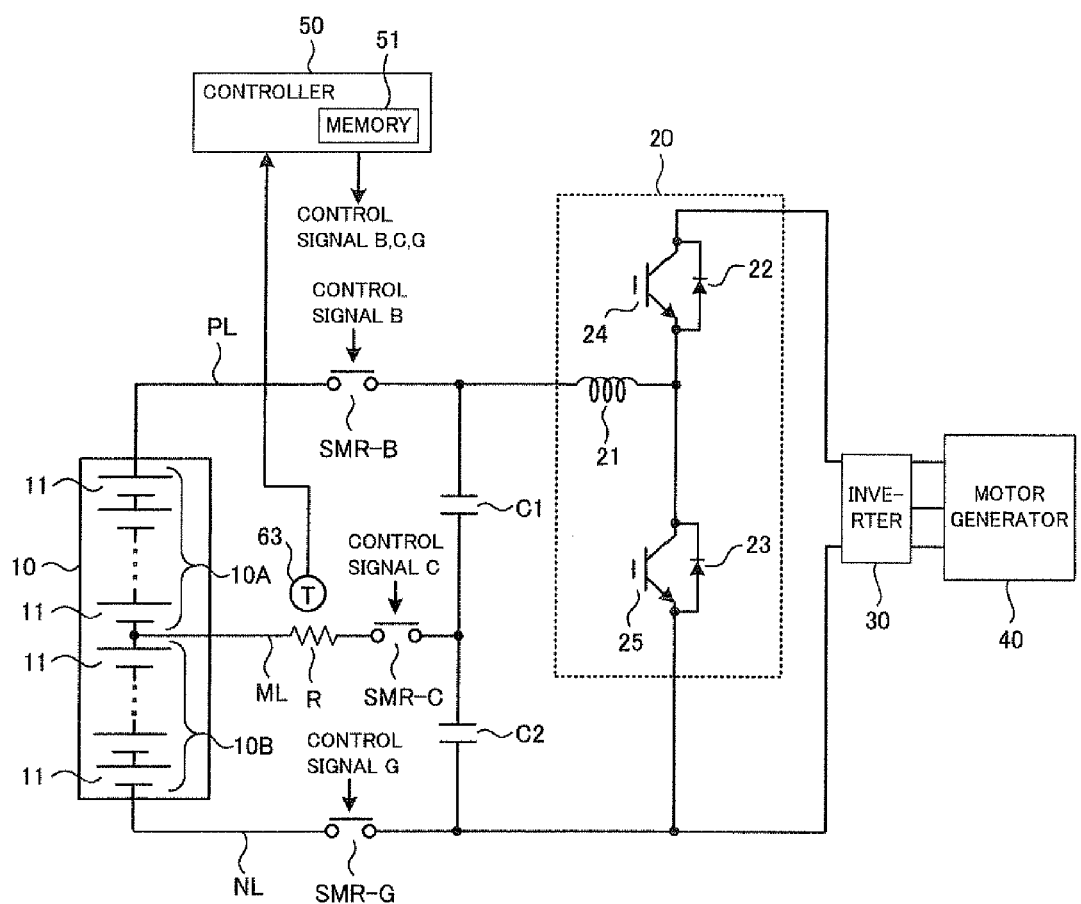
FIG. 8 is a diagram showing the configuration of a battery system which is Embodiment 3.

A battery system which is Embodiment 3 of the present invention is described. FIG. 8 shows the configuration of the battery system according to the present embodiment. Members identical to those described in Embodiment 1 are designated with the same reference numerals, and detailed description thereof is omitted. The following description focuses on differences from Embodiment 1.

A temperature sensor 63 detects the temperature of a current limiting resistance R and outputs the detection result to a controller 50. It is only required that the temperature sensor 63 should detect the temperature of the current limiting resistance R, and the position to place the temperature sensor 63 can be set as appropriate.

Figure 9:
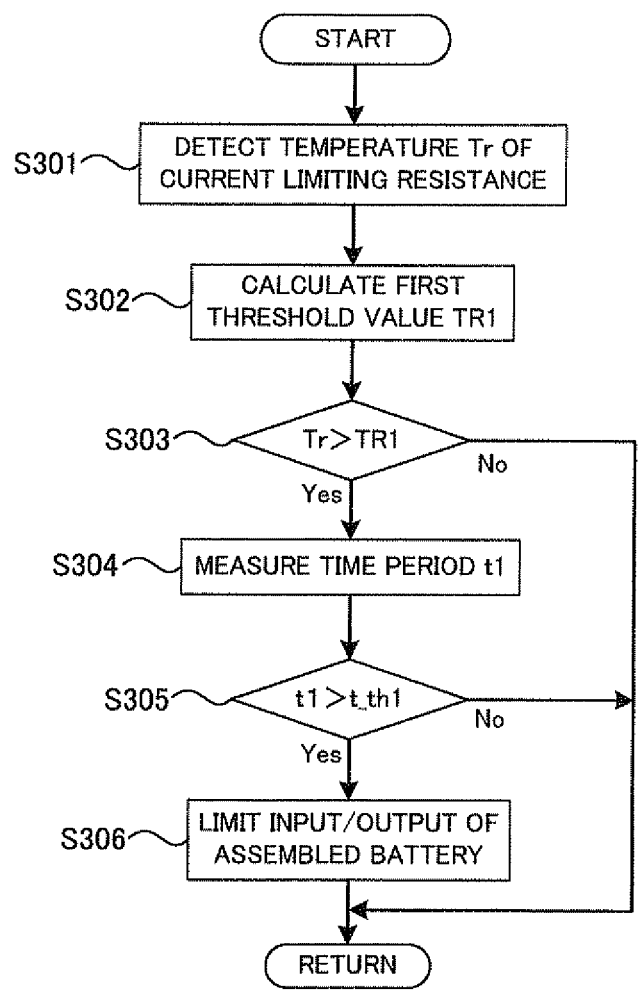
FIG. 9 is a flow chart showing part of processing in the battery system which is Embodiment 3.

FIG. 9 is a flow chart for describing part of processing in the battery system according to the present embodiment. The processing shown in FIG. 9 is performed by the controller 50.

At step S301, the controller 50 obtains a temperature Tr of the current limiting resistance R based on the output of the temperature sensor 63. At step S302, the controller 50 calculates a first threshold value TR1. The first threshold value TR1 is a value relating to the temperature and is used to determine whether or not the temperature of the current limiting resistance R is an abnormal state. The first threshold value TR1 may be a fixed value or may be changed in accordance with the use environments of the assembled battery 10. For changing the first threshold value TR1, a map representing the correspondence between the use environments of the assembled battery 10 and the first threshold value TR1 is previously prepared and the map can be used to determine the first threshold value TR1 associated with the use environments of the assembled battery 10.

It is possible to consider, as the use environments of the assembled battery 10, the temperature of the assembled battery 10, the temperature outside the assembled battery 10, and the temperature of a heat exchange medium used for adjusting the temperature of the assembled battery 10, for example. At least one of these temperatures can be considered to create the abovementioned map. These temperatures can be obtained with the method described in Embodiment 2.

At step S303, the controller 50 determines whether or not the temperature Tr detected at step S301 is higher than the first threshold value TR1 calculated at step S302. When the detected temperature Tr is higher than the first threshold value TR1, the procedure proceeds to step S304, and when not, the present procedure is ended.

At step S304, the controller 50 measures a time period t1 with a timer. The time period t1 is a time period (duration) for which the detected temperature Tr1 is higher than the first threshold value TR1. At step S305, the controller 50 determines whether or not the time period t1 measured at step S304 is longer than a predetermined time period t_th1. The predetermined time period t_th1 can be set as appropriate, and information about the predetermined time period t_th1 can be stored in a memory 51.

As described later, the input/output of the assembled battery 10 may be limited depending on the relationship between the measured time period t1 and the predetermined time period t_th1. As the predetermined time period t_th1 is set to be shorter, the input/output of the assembled battery 10 is limited more easily. As the predetermined time period t_th1 is set to be longer, the input/output of the assembled battery 10 is limited less easily. The predetermined time period t_th1 can be set as appropriate by taking account of that fact and the heat generation state of the current limiting resistance R.

When the measured time period t1 is longer than the predetermined time period t_th1, the procedure proceeds to processing at step S306, or when not, the procedure is ended. At step S306, the controller 50 limits the input/output (charge/discharge) of the assembled battery 10. The limitation of the input/output of the assembled battery 10 is performed in the same manner as that described in Embodiment 2.

In the processing shown in FIG. 9, when the temperature Tr of the current limiting resistance R is higher than the first threshold value TR1 over the predetermined time period t_th1, the input/output of the assembled battery 10 can be limited to reduce the value of the electric current passing through the current limiting resistance R. This can suppress a temperature rise in the current limiting resistance R.

While it is determined whether or not the temperature Tr of the current limiting resistance R is higher than the first threshold value TR1 over the predetermined time period t_th1 in the processing shown in FIG. 9, the present invention is not limited thereto. Specifically, the input/output of the assembled battery 10 can be limited at the time when the detected temperature Tr becomes higher than the first threshold value TR1. In other words, the processing at step S304 and S305 may be omitted in FIG. 9.

Figure 10:
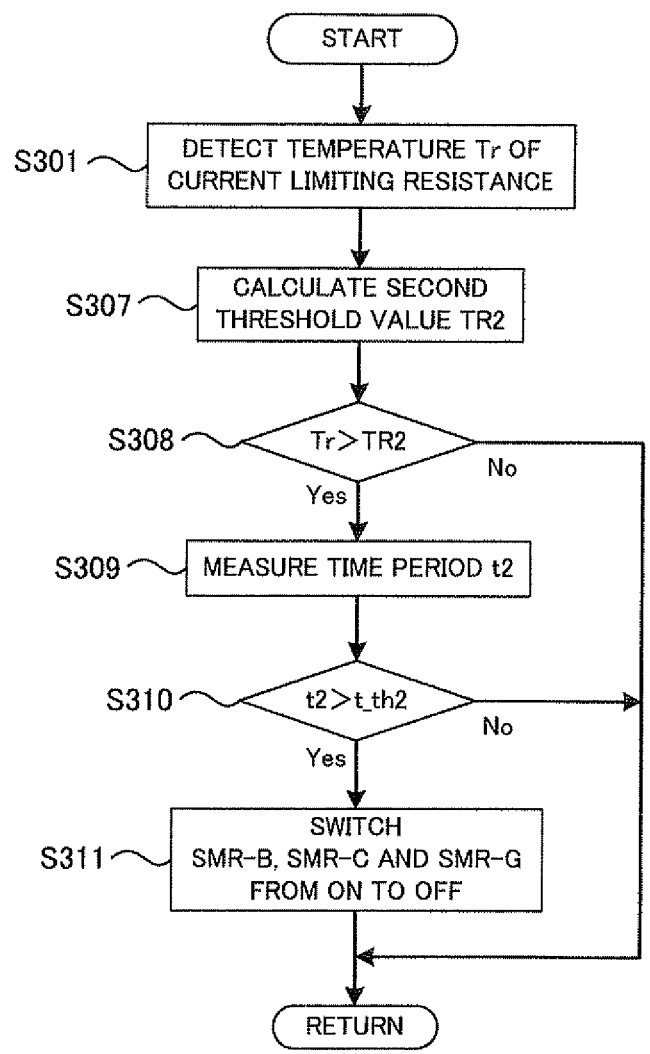
FIG. 10 is a flow chart showing part of the processing in the battery system which is Embodiment 3.

FIG. 10 is a flow chart for describing part of the processing in the battery system according to the present embodiment. The processing shown in FIG. 10 is performed by the controller 50. In the processing shown in FIG. 10, processing steps identical to those described in FIG. 9 are designated with the same reference numerals, and detailed description thereof is omitted.

At step S307, the controller 50 calculates a second threshold value TR2. The second threshold value TR2 is used to determine whether or not the temperature of the current limiting resistance R is in an abnormal state. The second threshold value TR2 can be a temperature value higher than the first threshold value TR1.

The second threshold value TR2 may be a fixed value or may be changed in accordance with the use environments of the assembled battery 10. For changing the second threshold value TR2, a map representing the correspondence between the use environments of the assembled battery 10 and the second threshold value TR2 is previously prepared and the map can be used to determine the second threshold value TR2 associated with the use environments of the assembled battery 10, as described at step S302.

At step S308, the controller 50 determines whether or not the temperature Tr detected at step S301 is higher than the second threshold value TR2 calculated at step S307. When the detected temperature Tr is higher than the second threshold value TR2, the procedure proceeds to processing at step S309, and when not, the procedure is ended.

At step S309, the controller 50 measures a time period t2 with a timer. The time period t2 is a time period (duration) for which the detected temperature Tr is higher than the second threshold value TR2. At step S310, the controller 50 determines whether or not the time period t2 measured at step S309 is longer than a predetermined time period t_th2. The predetermined time period t_th2 can be set as appropriate, and information about the predetermined time period t_th2 can be stored in the memory 51. The predetermined time period t_th2 may be identical to or different from the predetermined time period t_th1 used at step S305 in FIG. 9.

As described later, the system main relays SMR-B, SMR-C, and SMR-G may be switched from ON to OFF to prevent the input/output of the assembled battery 10 depending on the relationship between the measured time period t2 and the predetermined time period t_th2. As the predetermined time period t_th2 is set to be shorter, the system main relays SMR-B, SMR-C, and SMR-G are switched from ON to OFF more easily. As the predetermined time period t_th2 is set to be longer, the system main relays SMR-B, SMR-C, and SMR-G are switched from ON to OFF less easily. The predetermined time period t_th2 can be set as appropriate by taking account of that fact and the heat generation state of the current limiting resistance R.

When the measured time period t2 is longer than the predetermined time period t_th2, the procedure proceeds to processing at step S311, or when not, the procedure is ended. At step S311, the controller 50 switches the system main relays SMR-B, SMR-C, and SMR-G from ON to OFF. This prevents the input/output of the assembled battery 10. When the vehicle in the present embodiment is a hybrid vehicle, the vehicle can be run by using the output of an engine or a fuel cell.

While the second threshold value TR2 is set to be higher than the first threshold value TR1 in the processing shown in FIG. 10, the second threshold value TR2 can be set to the same value as the first threshold value TR1. When the first threshold value TR1 is the same value as the second threshold value TR2, the processing shown in FIG. 10 can be given a higher priority than the processing shown in FIG. 9.

According to the processing shown in FIG. 10, the system main relays SMR-B, SMR-C, and SMR-G can be turned off to prevent an electric current from passing through the current limiting resistance R to suppress a temperature rise in the current limiting resistance R. While the system main relays SMR-B, SMR-C, and SMR-G are turned off in the processing at step S311, only the system main relay SMR-C may be turned off instead. In this case, the heat generation of the current limiting resistance R can also be suppressed.

While it is determined whether or not the temperature of the current limiting resistance R is higher than the second threshold value TR2 over the predetermined time period t_th2 in the processing shown in FIG. 10, the present invention is not limited thereto. Specifically, the system main relays SMR-B, SMR-C, and SMR-G can be turned off to prevent the input/output of the assembled battery 10 at the time when the temperature Tr of the current limiting resistance R becomes higher than the second threshold value TR2. In other words, the processing at step S309 and S310 can be omitted in FIG. 10.

Figure 11:
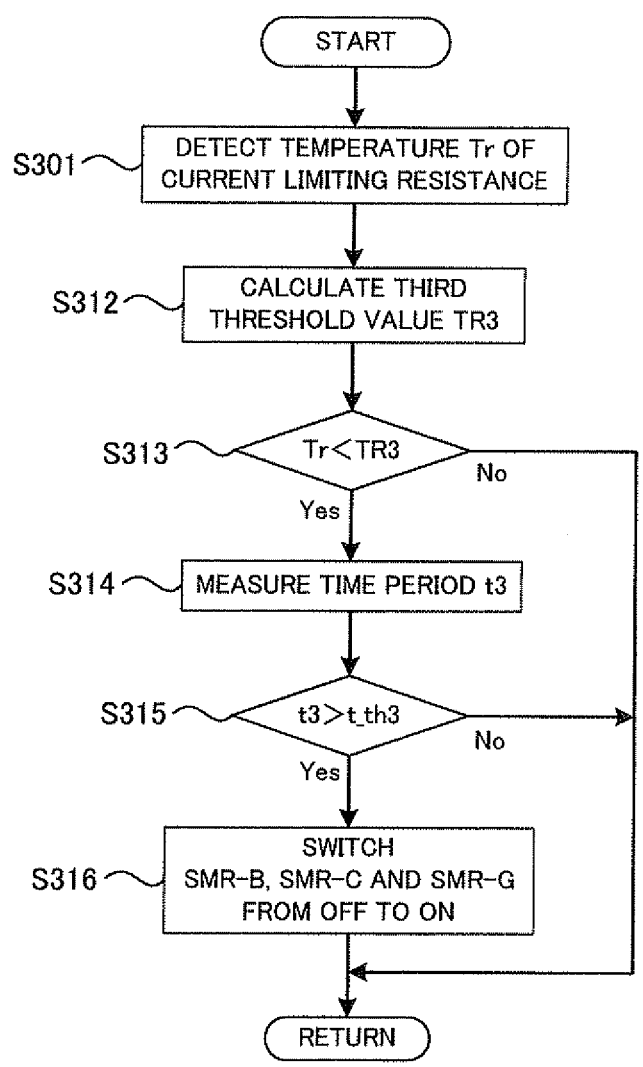
FIG. 11 is a flow chart showing part of the processing in the battery system which is Embodiment 3.

FIG. 11 is a flow chart for describing part of the processing in the battery system, according to the present embodiment. The processing shown in FIG. 11 is performed by the controller 50. In the processing shown in FIG. 11, processing steps identical to those described in FIG. 9 are designated with the same reference numerals, and detailed description thereof is omitted. The processing shown in FIG. 11 can principally be performed after the system main relays SMR-B, SMR-C, and SMR-G are turned off through the processing at step S311 shown in FIG. 10.

At step S312, the controller 50 calculates a third threshold value TR3. The third threshold value TR3 is used to determine whether or not the temperature of the current limiting resistance R is in a normal state. The third threshold value TR3 can be a value lower than the first threshold value TR1 and the second threshold value TR2.

The third threshold value TR3 may be a fixed value or may be changed in accordance with the use environments of the assembled battery 10. For changing the third threshold value TR3, a map representing the correspondence between the use environments of the assembled battery 10 and the third threshold value TR3 is previously prepared and the map can be used to determine the third threshold value TR3 associated with the use environments of the assembled battery 10, similarly to the change of the first threshold value TR1 and the second threshold value TR2.

At step S313, the controller 50 determines whether or not the temperature Tr detected at step S301 is lower than the third threshold value TR3 calculated at step S312. When the detected temperature Tr is lower than the third threshold value TR3, the procedure proceeds to processing at step S314, and when not, the procedure is ended.

At step S314, the controller 50 measures a time period t3 with a timer. The time period t3 is a time period (duration) for which the detected temperature Tr is lower than the third threshold value TR3. At step S315, the controller 50 determines whether or not the time period t3 measured at step S314 is longer than a predetermined time period t_th3. The predetermined time period t_th3 can be set as appropriate, and information about the predetermined time period t_th3 can be stored in the memory 51. The predetermined time period t_th3 may be identical to or different from the predetermined time period t_th1 used at step S305 in FIG. 9 or the predetermined time period t_th2 used at step S310 in FIG. 10.

As described later, the system main relays SMR-B, SMR-C, and SMR-G may be switched from OFF to ON to start the input/output of the assembled battery 10 depending on the relationship between the measured time period t3 and the predetermined time period t_th3. As the predetermined time period t_th3 is set to be shorter, the input/output of the assembled battery 10 is started more easily. As the predetermined time period t_th3 is set to be longer, the input/output of the assembled battery 10 is started less easily. The predetermined time period t_th3 can be set as appropriate by taking account of that face and the heat generation state of the current limiting resistance R.

When the measured time period t3 is longer than the predetermined time period t_th3, the procedure proceeds to processing at step S316, or when not, the procedure is ended. At step S316, the controller 50 switches the system main relays SMR-B, SMR-C, and SMR-G from OFF to ON. The switching of the system main relays SMR-B, SNR-C, and SMR-G from OFF to ON is performed in the same manner as that of the processing shown in FIG. 3. When only the system main relay SMR-C is turned off in the processing at step S311 in FIG. 10, only the system main relay SMR-C may be turned on.

According to the processing shown in FIG. 11, the charge and discharge of the assembled battery 10 can be resumed with the heat generation of the current limiting resistance R suppressed.

In turning on the system main relays SMR-B, SMR-C, and SMR-G, the input/output of the assembled battery 10 may or may not be limited. When the input/output of the assembled battery 10 is limited, the limitation of the input/output can be canceled depending on the relationship between the temperature Tr of the current limiting resistance R and the first threshold value TR1. Specifically, when the temperature Tr of the current limiting resistance R is lower than the first threshold value TR1, the limitation of the input/output of the assembled battery 10 can be canceled. On the other hand, when the temperature Tr of the current limiting resistance R is higher than the first threshold value TR1, the limitation of the input/output of the assembled battery 10 can be continued.

While it is determined whether or not the temperature Tr of the current limiting resistance R is lower than the third threshold value TR3 over the predetermined time period t_th3 in the processing shown in FIG. 11, the present invention is not limited thereto. Specifically, the system main relays SMR-B, SMR-C, and SMR-G can be turned on to start the input/output of the assembled battery 10 at the time when the temperature Tr of the current limiting resistance R becomes lower than the third threshold value TR3. In other words, the processing at step S314 and S315 can be omitted in FIG. 11.

The invention claimed is:

1. An electric storage system for connection to a load, the electric storage system comprising:
an electric storage apparatus having a plurality of electric storage elements connected in series, each of the electric storage elements including a current breaker breaking an internal electric current path;
a relay placed on each of a positive electrode line and a negative electrode line, the positive electrode line connecting a positive electrode terminal of the electric storage apparatus to a first side of the load and the negative electrode line connecting a negative electrode terminal of the electric storage apparatus to a second side of the load;
a plurality of smoothing capacitors connected in series between the positive electrode line and the negative electrode line; and
a relay and a current limiting resistance each placed on an intermediate line connecting a connecting point of two of the electric storage elements included in the electric storage apparatus and a connecting point of the plurality of smoothing capacitors, wherein
the electric storage apparatus conducts charge and discharge with the load through the positive electrode line and the negative electrode line, and one end of the intermediate line connects to the connecting point of the smoothing capacitors and the other end of the intermediate line connects to the connecting point of the electric storage elements.

2. The electric storage system according to claim 1, wherein the electric storage apparatus is divided into a first group and a second group, the groups including substantially equal numbers of the electric storage elements, and
the intermediate line is connected to a connecting point of the first group and the second group.

3. The electric storage system according to claim 2, wherein the plurality of smoothing capacitors include:
a smoothing capacitor connected in parallel with the first group through the positive electrode line and the intermediate line; and
a smoothing capacitor connected in parallel with the second group through the negative electrode line and the intermediate line.

4. The electric storage system according to claim 1, further comprising a controller controlling ON and OFF of each of the relays,
wherein the controller switches the relay placed on one of the positive electrode line and the negative electrode line and the relay placed on the intermediate line from OFF to ON, and then switches the relay placed on the other of the positive electrode line and the negative electrode line from OFF to ON, when connecting the electric storage apparatus to the load.

5. The electric storage system according to claim 1, further comprising:
a first current sensor detecting a value of an electric current passing through the positive electrode line;
a second current sensor detecting a value of an electric current passing through the negative electrode line; and
a controller using the detection results of the first current sensor and the second current sensor to obtain a value of an electric current passing through the intermediate line,
wherein the controller limits charge and discharge of the electric storage apparatus in response to an increase in the electric current value of the intermediate line.

6. The electric storage system according to claim 5, wherein the controller reduces an upper limit to power with which charge or discharge of the electric storage apparatus is allowed, when the electric current value of the intermediate line is higher than a first threshold value.

7. The electric storage system according to claim 5, wherein the controller turns off the relays placed on the positive electrode line, the negative electrode line, and the intermediate line when the electric current value of the intermediate line is higher than a second threshold value.

8. The electric storage system according to claim 1, further comprising;
a temperature sensor detecting a temperature of the current limiting resistance; and
a controller limiting charge and discharge of the electric storage apparatus in response to an increase in the temperature detected by the temperature sensor.

9. The electric storage system according to claim 8, wherein the controller reduces an upper limit to power with which charge or discharge of the electric storage apparatus is allowed, when the detected temperature is higher than a first threshold value.

10. The electric storage system according to claim 8, wherein the controller turns off the relays placed on the positive electrode line, the negative electrode line, and the intermediate line when the detected temperature is higher than a second threshold value.

11. An electric storage system for connection to a load, the electric storage system comprising:
an electric storage apparatus having a plurality of electric storage elements connected in series, each of the electric storage elements including a current breaker breaking an internal electric current path;
a relay placed on each of a positive electrode line and a negative electrode line, the positive electrode line connecting a positive electrode terminal of the electric storage apparatus to the load and the negative electrode line connecting a negative electrode terminal of the electric storage apparatus to the load;
a plurality of smoothing capacitors connected in series between the positive electrode line and the negative electrode line; and
a relay and a current limiting resistance each placed on an intermediate line connecting a connecting point of two of the electric storage elements included in the electric storage apparatus and a connecting point of the plurality of smoothing capacitors, wherein:
the electric storage apparatus conducts charge and discharge with the load through the positive electrode line and the negative electrode line, and
a first end of the intermediate line connects to the connecting point of the smoothing capacitors and a second end of the intermediate line connects to the connecting point of the electric storage elements such that a T-junction is formed between the smoothing capacitors and the second end of the intermediate line.

12. The electric storage system according to claim 11, wherein the electric storage apparatus is divided into a first group and a second group, the groups including substantially equal numbers of the electric storage elements, and
the intermediate line is connected to a connecting point of the first group and the second group.

13. The electric storage system according to claim 12, wherein the plurality of smoothing capacitors include:
a smoothing capacitor connected in parallel with the first group through the positive electrode line and the intermediate line; and
a smoothing capacitor connected in parallel with the second group through the negative electrode line and the intermediate line.

14. The electric storage system according to claim 11, further comprising a controller controlling ON and OFF of each of the relays,
wherein the controller switches the relay placed on one of the positive electrode line and the negative electrode line and the relay placed on the intermediate line from OFF to ON, and then switches the relay placed on the other of the positive electrode line and the negative electrode line from OFF to ON, when connecting the electric storage apparatus to the load.

15. The electric storage system according to claim 11, further comprising:
a first current sensor detecting a value of an electric current passing through the positive electrode line;
a second current sensor detecting a value of an electric current passing through the negative electrode line; and
a controller using the detection results of the first current sensor and the second current sensor to obtain a value of an electric current passing through the intermediate line,
wherein the controller limits charge and discharge of the electric storage apparatus in response to an increase in the electric current value of the intermediate line.

16. The electric storage system according to claim 15, wherein the controller reduces an upper limit to power with which charge or discharge of the electric storage apparatus is allowed, when the electric current value of the intermediate line is higher than a first threshold value.

17. The electric storage system according to claim 15, wherein the controller turns off the relays placed on the positive electrode line, the negative electrode line, and the intermediate line when the electric current value of the intermediate line is higher than a second threshold value.

18. The electric storage system according to claim 11, further comprising;
a temperature sensor detecting a temperature of the current limiting resistance; and
a controller limiting charge and discharge of the electric storage apparatus in response to an increase in the temperature detected by the temperature sensor.

19. The electric storage system according to claim 18, wherein the controller reduces an upper limit to power with which charge or discharge of the electric storage apparatus is allowed, when the detected temperature is higher than a first threshold value.

20. The electric storage system according to claim 18, wherein the controller turns off the relays placed on the positive electrode line, the negative electrode line, and the intermediate line when the detected temperature is higher than a second threshold value.

* * * * *